(12) United States Patent
Dadvand et al.

(10) Patent No.: US 12,154,845 B2
(45) Date of Patent: Nov. 26, 2024

(54) SEMICONDUCTOR PACKAGE WITH NICKEL-SILVER PRE-PLATED LEADFRAME

(71) Applicant: TEXAS INSTRUMENTS INCORPORATED, Dallas, TX (US)

(72) Inventors: Nazila Dadvand, Santa Clara, CA (US); Bernardo Gallegos, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/389,651

(22) Filed: Dec. 19, 2023

(65) Prior Publication Data
US 2024/0153853 A1 May 9, 2024

Related U.S. Application Data

(62) Division of application No. 17/139,985, filed on Dec. 31, 2020, now Pat. No. 11,848,258.

(51) Int. Cl.
*H01L 23/495* (2006.01)
*H01L 21/48* (2006.01)
(Continued)

(52) U.S. Cl.
CPC .... *H01L 23/49582* (2013.01); *H01L 21/4825* (2013.01); *H01L 21/4835* (2013.01); *H01L 21/565* (2013.01); *H01L 23/3114* (2013.01); *H01L 23/49513* (2013.01); *H01L 23/4952* (2013.01); *H01L 23/562* (2013.01); *H01L 24/48* (2013.01); *H01L 24/85* (2013.01); *H01L 2224/48465* (2013.01); *H01L 2224/48639* (2013.01); *H01L 2224/48655* (2013.01); *H01L 2224/48739* (2013.01);
(Continued)

(58) Field of Classification Search
CPC .......... H01L 23/49582; H01L 23/3114; H01L 23/49513; H01L 23/4952; H01L 23/562; H01L 21/4825; H01L 21/565
See application file for complete search history.

(56) References Cited

U.S. PATENT DOCUMENTS 5,389,226 A  2/1995 Scruggs et al.
8,105,932 B2  1/2012 Ong Wai Lian et al.
(Continued)

*Primary Examiner* — Marc Anthony Armand
(74) *Attorney, Agent, or Firm* — Dawn Jos; Frank D. Cimino

(57) ABSTRACT

A semiconductor package includes a pad and leads, the pad and leads including a base metal predominantly including copper, a first plated metal layer predominantly including nickel in contact with the base metal, and a second plated metal layer predominantly including silver in contact with the first plated metal layer. The first plated metal layer has a first plated metal layer thickness of 0.1 to 5 microns, and the second plated metal layer has a second plated metal layer thickness of 0.2 to 5 microns. The semiconductor package further includes an adhesion promotion coating predominantly including silver oxide in contact with the second plated metal layer opposite the first plated metal layer, a semiconductor die mounted on the pad, a wire bond extending between the semiconductor die and a lead of the leads, and a mold compound covering the semiconductor die and the wire bond.

12 Claims, 7 Drawing Sheets

(51) Int. Cl.
  *H01L 21/56*  (2006.01)
  *H01L 23/00*  (2006.01)
  *H01L 23/31*  (2006.01)

(52) U.S. Cl.
  CPC .............. *H01L 2224/48755* (2013.01); *H01L 2224/48839* (2013.01); *H01L 2224/48855* (2013.01); *H01L 2224/85205* (2013.01); *H01L 2924/01027* (2013.01); *H01L 2924/01028* (2013.01); *H01L 2924/01042* (2013.01); *H01L 2924/01047* (2013.01); *H01L 2924/01057* (2013.01); *H01L 2924/01074* (2013.01); *H01L 2924/15747* (2013.01); *H01L 2924/35121* (2013.01)

(56) References Cited

U.S. PATENT DOCUMENTS

| | | |
|---|---|---|
| 8,819,930 B2 | 9/2014 | Wunderlich et al. |
| 9,059,185 B2 | 6/2015 | Abbott |
| 10,658,278 B2 | 5/2020 | Koduri |
| 2003/0011048 A1 | 1/2003 | Abbott et al. |
| 2014/0302640 A1* | 10/2014 | Qin .................... H01L 21/4825 438/108 |
| 2014/0319666 A1* | 10/2014 | Paek ................. H01L 23/49582 257/676 |
| 2016/0043019 A1* | 2/2016 | Huang .............. H01L 23/49513 174/257 |
| 2019/0279942 A1 | 9/2019 | Crema et al. |
| 2020/0006267 A1 | 1/2020 | Lee et al. |
| 2020/0357766 A1 | 11/2020 | Su |
| 2021/0159189 A1 | 5/2021 | Yu et al. |

\* cited by examiner

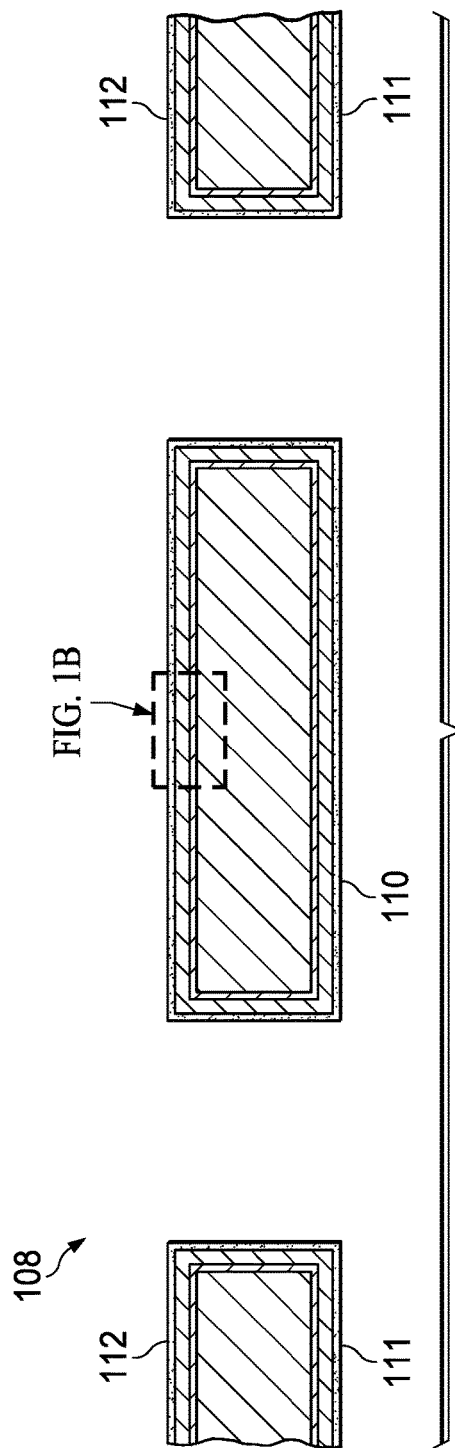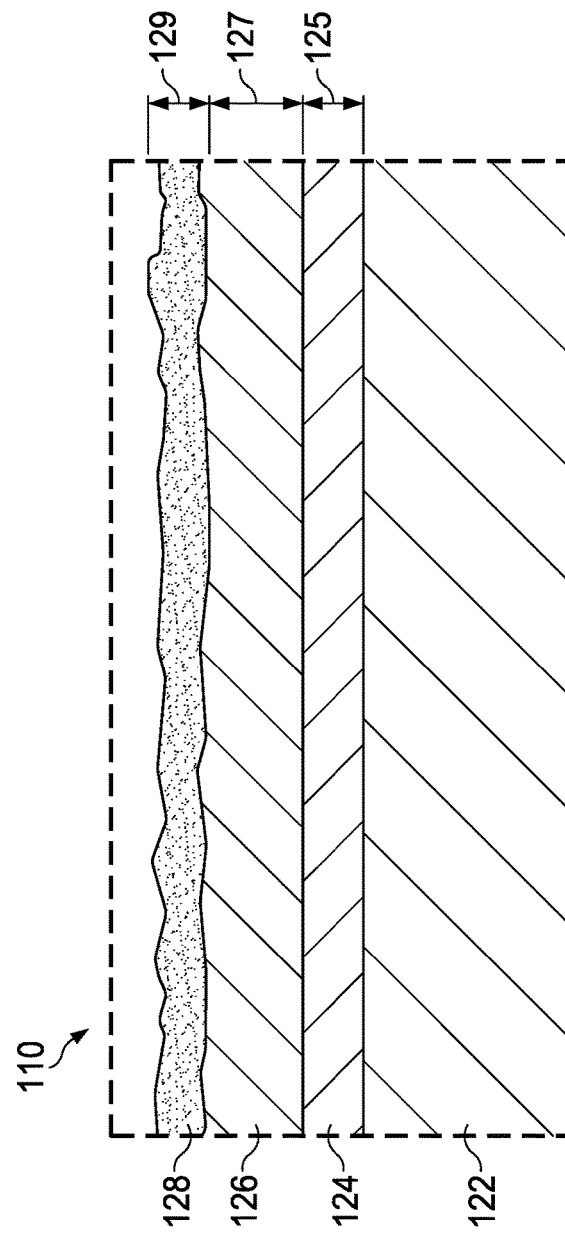
FIG. 1A
FIG. 1B

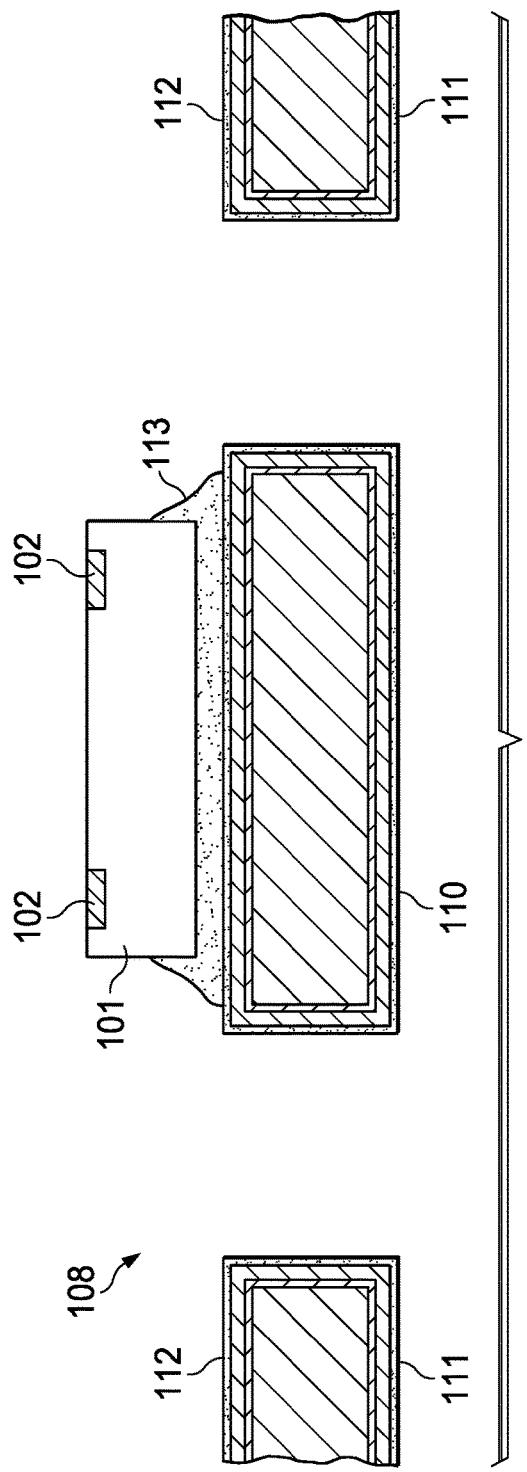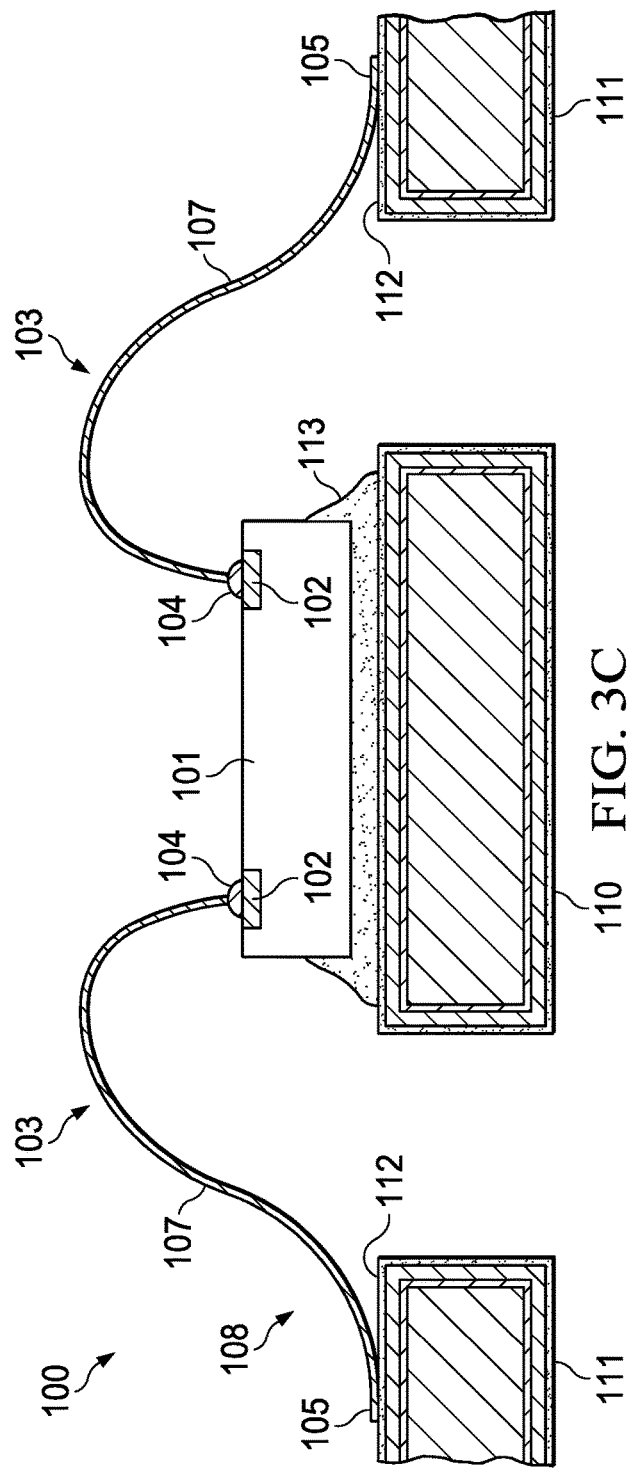

SEMICONDUCTOR PACKAGE WITH NICKEL-SILVER PRE-PLATED LEADFRAME

This application is a division to U.S. patent application Ser. No. 17/139,985, filed Dec. 31, 2020, the contents of which are herein incorporated by reference in its entirety.

TECHNICAL FIELD

This disclosure relates to semiconductor packages.

BACKGROUND

Semiconductor devices including active and/or passive components may be manufactured into round wafers sliced from elongated cylinder-shaped single crystals of semiconductor elements or compounds. The diameter of these solid-state wafers may reach up to 12 inches or more. Individual semiconductor dies are typically singulated from a round wafer by sawing streets in X- and Y-directions through the wafer in order to create rectangularly shaped discrete pieces from the wafers.

Each semiconductor die includes at least one active or passive component and bond pads serving to facilitate electric connections to the component(s) of the semiconductor die. A bond pad may be a build-up layer of metal, such as aluminum or thick copper with nickel palladium plating, over a metallization layer of a semiconductor die. Semiconductor dies include many large families of functional circuits; examples include active devices such as diodes and transistors like field-effect transistors, passive devices such as resistors and capacitors, and integrated circuits (ICs), which can include far more than a million active and passive components.

After singulation, one or more semiconductor dies are attached to a discrete supporting substrate such as a metal leadframe or a rigid multi-level substrate laminated from a plurality of metallic and insulating layers. The conductive traces of the leadframes and substrates are connected to the bonds pads, typically using wire bonds or metal bumps such as solder bumps.

Leadframes may include a pad and one or more leads. The pad serves as a substrate providing a stable support for firmly positioning a semiconductor die within the semiconductor package during manufacturing, whereas the leads provide electrical connections from outside the package to the active surface of the semiconductor die. Gaps between the inner end of the leads and contact pads on the active surface of the semiconductor die are bridged by connectors, typically wire bonds—thin metal wires, such as gold or copper wires, individually bonded to both the bond pads and the leads.

Leadframes for semiconductor devices provide a stable support pad for firmly positioning the semiconductor die, usually an IC, within a package. In addition, leadframes offer a plurality of leads as terminals of the packaged device. Single piece leadframes may be manufactured from thin (about 100 to 300 µm) sheets of metal. For reasons of easy manufacturing, the commonly selected starting metals are copper alloys, iron-nickel alloys (for instance the so-called "Alloy 42"), and aluminum. The desired shape of the leadframe is stamped or etched from the original sheet. An individual lead of the leadframe typically takes the form of a thin metallic strip with the particular geometric shape determined by the design. For most purposes, the length of a typical lead is considerably longer than its width.

In a typical leadframe, the leads are brought into close proximity of the chip so that the remaining gaps between the proximate ends of the leads (so-called inner lead ends) and the contact pads on the IC surface can be bridged by connectors, for which conventionally thin metal wires such as gold are selected with a diameter range from about 20 to 30 µm. Recently, for cost reduction purposes and improved electrical performance, copper wire has replaced gold wire in some applications. Consequently, the surface of the inner lead ends has to be metallurgically suitable for stitch-attaching the connectors, while ball-attaching of the connectors is the preferred method at the chip contacts. In order to facilitate the stitch attachment especially for copper wires, silver is selectively plated directly on the copper-alloy leadframe in the area for stitch bonding (so-called spot-plating). Alternatively, the entire surface of a copper alloy leadframe is flood-plated with a stack of metal layers including nickel (Ni) on the copper, followed by palladium (Pd) and by gold (Au) to ensure stitch bonding with copper wires.

The ends of the leads remote from the IC chip (so-called outer lead ends) need to be electrically and mechanically connected to external circuitry such as printed circuit boards. This attachment is customarily performed by soldering, conventionally with a tin alloy solder at a reflow temperature above 200° C. Consequently, the surface of the outer segment ends needs to have a metallurgical configuration suitable for reflow attachment to external parts. Copper leadframes spot-plated with silver require post-mold plating of matte tin of the leads outside the plastic to guarantee solderability of the leads by the end user. Leadframes flood-plated with Ni—Pd—Au are solderable without the need for post-mold plating.

Finally, the leadframe provides the framework for encapsulating the sensitive chip and fragile connecting wires. Encapsulation using plastic materials, rather than metal cans or ceramic, has been the preferred method due to low cost. The transfer molding process for epoxy-based thermoset compounds at 175° C. has been practiced for many years. The temperature of 175° C. for molding and mold curing (polymerization) is compatible with the temperature of >200° C. for eutectic solder reflow, or for reflow at temperatures >250° C. for Pb-free solder alloys.

Reliability tests such as temperature cycling in moist environments require that the molding compounds have good adhesion to the leadframe and to the encapsulated device parts. Two major contributors to good adhesion are the chemical affinity between the molding compound and the metal finish of the leadframe, and the surface roughness of the leadframe.

BRIEF SUMMARY

Whole leadframes are pre-plated with a nickel alloy on a base metal layer, followed by silver, leaving a wire-bondable and moldable finish. To produce a usable pre-plated leadframe including nickel alloy and silver layers, a number of challenges were overcome including limiting a thickness of the silver layer to provide an economically viable configuration, mitigating diffusion of the silver layer into the base layer (such as copper) of the leadframe, mitigating delamination at the interface of the nickel alloy and silver layers during wire bonding, and improving adhesion between the silver layer and a mold compound while supporting wire-bonding on the same surface.

Techniques of this disclosure may provide a number of advantages compared to existing leadframes and leadframe manufacturing processes. For example, compared to an existing leadframe with selective plating silver spots for wire bonding, the photomask and post mold plating steps can be removed, saving processing time and cost. As another example, compared to pre-plating whole leadframes with stacked Ni—Pd—Au finishes, the preplated leadframes disclosed herein do not require either Pd or Au layers, both of which have significant material costs.

In one example, a semiconductor package includes a pad and leads, the pad and leads including a base metal predominantly including copper, a first plated metal layer in contact with the base metal, the first plated metal layer predominantly including nickel, and a second plated metal layer in contact with the first plated metal layer. The first plated metal layer has a first plated metal layer thickness of 0.1 to 5 microns, and the second plated metal layer has a second plated metal layer thickness of 0.2 to 5 microns. The semiconductor package further includes an adhesion promotion coating in contact with the second plated metal layer opposite the first plated metal layer, the adhesion promotion coating predominantly including silver oxide, a semiconductor die mounted on the pad, a wire bond extending between the semiconductor die and a lead of the leads, and a mold compound covering the semiconductor die and the wire bond.

In another example, a method for fabricating a semiconductor package includes forming a ball bond of a copper wire on a semiconductor die attached to a metal pad of a pre-plated leadframe, forming a stitch bond of the copper wire on a lead of the pre-plated leadframe to complete a wire bond between the semiconductor die and the lead, and covering the semiconductor die and wire bond in a mold compound. The pre-plated leadframe includes a base metal predominantly including copper, and a first plated metal layer in contact with the base metal, the first plated metal layer predominantly including nickel. The first plated metal layer has a first plated metal layer thickness of 0.1 to 5 microns. The pre-plated leadframe further includes a second plated metal layer in contact with the first plated metal layer, the second plated metal layer predominantly including silver. The second plated metal layer has a second plated metal layer thickness of 0.2 to 5 microns. The pre-plated leadframe also includes an adhesion promotion coating in contact with the second plated metal layer opposite the first plated metal layer, the adhesion promotion coating predominantly including silver oxide.

BRIEF DESCRIPTION OF THE DRAWINGS

FIGS. 1A and 1B illustrate a pre-plated leadframe with a nickel-plating layer over a base metal and a silver-plating layer over the nickel-plating layer.

FIGS. 3A-3C illustrate conceptual process steps for manufacturing a semiconductor package including wire bonds between bond pads of a semiconductor die and leads of a pre-plated leadframe, such as the semiconductor package of FIG. 2.

DETAILED DESCRIPTION

Figure 2:
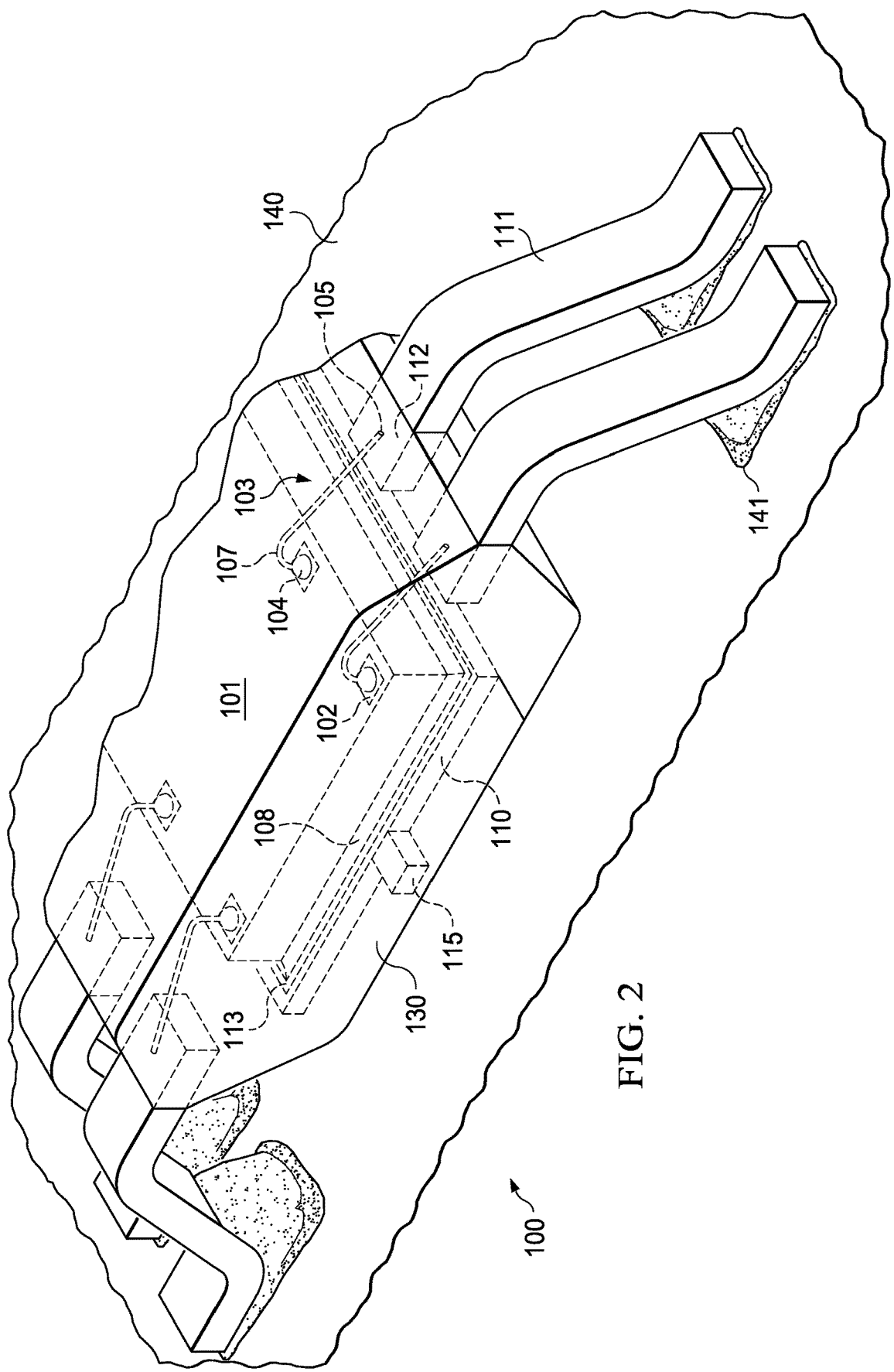
FIG. 2 is a perspective hidden view of a portion of a semiconductor package including the pre-plated leadframe of FIGS. 1A and 1B.

A number of technical trends have made reliable semiconductor package construction more difficult. As examples, the package dimensions are shrinking, offering less surface for adhesion. Then, the desire to use Pb-free solders pushes the reflow temperature range into the neighborhood of about 260° C., making it more difficult to maintain mold compound adhesion to the leadframes. This is especially true for the very small leadframe surface available in Quad Flat No-lead (QFN) and Small Outline No-lead (SON) devices. Moreover, prices and demand for metals commonly used in pre-plated leadframe finishes, including palladium (Pd), are expected to continue to rise.

Recognizing the high cost associated with selective plating silver spots, and of pre-plating whole leadframes with stacked Ni—Pd—Au finishes, Applicant has developed novel and innovative techniques for a pre-plated leadframe.

As disclosed herein, a pre-plated leadframe includes a base metal of predominately copper, a first plated metal layer predominantly including nickel in contact with the base metal, a second plated metal layer predominantly including silver in contact with the first plated metal layer, and adhesion promotion coating in contact with the second plated metal layer opposite the first plated metal layer, the adhesion promotion coating including silver oxide. As referred to herein, an adhesion promotion coating is a coating with stronger mechanical bonding to mold compound than the immediately adjacent layer, in this case, the plated metal layer predominantly including silver.

The preferred thickness range of the first plated metal layer on the base metal is between about 0.10 and 5.0 µm, and the second plated metal layer between about 0.20 and 5.0 µm. The nickel protects the base metal copper from oxidation, and further protects the silver layer from diffusion in the copper alloy during wire bonding, allowing for a thinner silver layer than is common with selective plating silver spots. The adhesion promotion coating is in contact with the silver layer to promote adhesion between exposed portions of the leadframe and mold compound. One such example of the disclosed techniques is plated metallic leadframe 108, as illustrated in FIGS. 1A and 1B.

FIGS. 1A and 1B illustrate a portion of a pre-plated leadframe 108. Pre-plated leadframe 108 includes a metal pad 110 and leads 111. Metal pad 110 and end portions 112 of each lead 111 are illustrated in FIG. 1A. FIG. 1B is a close-up view of the plating layers of leadframe 108, as indicated in FIG. 1A.

Leadframe 108 includes a base metal 122 forming the different elements of leadframe 108, including metal pad 110, leads 111 and pad straps 115 (FIG. 2). A first plated metal layer 124, predominantly including nickel, is in contact with base metal 122. A second plated metal layer 126, predominantly including silver, is in contact with first plated metal layer 124. An adhesion promotion coating 128, primarily including silver oxide, is in contact with second plated metal layer 126 opposite first plated metal layer 124, the adhesion promotion coating including silver oxide. As referred to herein, "predominately including" means greater than fifty percent by weight, up to one hundred percent by weight.

In some examples, base metal 122 predominantly includes copper, such as a copper alloy. Examples of suitable copper alloys for base metal 122 include aluminum bronze (copper ninety-two percent by weight, aluminum eight percent by weight), beryllium copper (copper ninety-eight percent by weight, beryllium two percent by weight), cartridge brass (copper seventy percent by weight, zinc thirty percent by weight), cupronickel (copper seventy percent by weight, nickel thirty percent by weight), gunmetal (copper ninety percent by weight, tin ten percent by weight). nickel silver (copper seventy-eight percent by weight, nickel twelve percent by weight, lead ten percent by weight), as well as copper alloys C19210, C19400, and C70250 under the unified numbering system. In other examples, base metal 122 may predominantly include iron-nickel alloys (for instance the so-called "Alloy 42"), or aluminum.

Plated metal layer 124 is in contact with base metal 122. Plated metal layer 124 predominantly includes nickel, such as a nickel alloy. A thickness 125 of plated metal layer 124 is 0.1 to 5 microns, such as 0.2 to 4 microns, such as 0.5 to 1.5 microns, such as about 1.0 micron. In various example, the nickel alloy may include one or more of: cobalt, molybdenum, a lanthanide, and tungsten (W). The hardness of plated metal layer 124 should be below 500 Vickers. With higher hardness, wire bonding may cause delamination between plated metal layer 124 and plated metal layer 126. As leadframe 108 is a pre-plated leadframe, plated metal layer 124 covers all or a majority of the surfaces of base metal 122, such as at least 90 percent of the total surface area of base metal 122. Uncovered portions of leadframe 108 may occur as a result of package manufacturing processes that include cutting or grinding pre-plated leadframe 108, such as singulation, which may include cutting tie bars of leadframe 108.

Including an alloy with the nickel in plated metal layer 124 reduces a thickness 125 required to mitigate diffusion of silver of plated metal layer 126 into base metal 122, particularly during wire-bonding. For example, whereas a thickness of up to 5 microns of pure nickel may be required to mitigate diffusion of silver of plated metal layer 126 into base metal 122, a much thinner alloyed nickel, as low as about 0.1 microns may be suitable to mitigate diffusion of silver of plated metal layer 126 into base metal 122 during wire bonding. Thus, utilizing a nickel alloy for plated metal layer 124 may reduce the amount of nickel required, saving on costs, and improve dimensional control compared to using pure nickel for plated metal layer 124.

Since plated metal layer 126 covers plated metal layer 124, plated metal layer 124 is substantially free of oxidized surface film (nickel oxide). As referred to herein, substantially free means at proportions that do not interfere with the practical function of the base material. For plated metal layer 124, its practical functions include electrical conductivity, mitigating diffusion of silver of plated metal layer 126 into base metal 122 during wire bonding, and absence of delamination at the interfaces of base metal 122 and plated metal layer 126, including during wire bonding.

Plated metal layer 126 is in contact with plated metal layer 124. Plated metal layer 126 predominantly includes silver, such as a pure silver or a silver alloy. A thickness 127 of plated metal layer 126 is 0.2 to 5 microns, such as 0.5 to 3.0 microns, such as 0.5 to 1.5 microns, such as about 1.0 micron. Plated metal layer 126 protects plated metal layer 124 from oxidation and provides a wire-bondable surface. As leadframe 108 is a pre-plated leadframe, plated metal layer 126 covers all or a majority of the surfaces of plated metal layer 124, such as at least 90 percent of the total surface area of plated metal layer 124.

An adhesion promotion coating 128 is in contact with plated metal layer 126 opposite plated metal layer 124. Adhesion promotion coating 128 predominantly includes silver oxide. A thickness 129 of adhesion promotion coating 128 is at least about 1.0 nanometer (nm), such as 1.0 to 3.0 nm. Adhesion promotion coating 128 covers all or a majority of the surfaces of plated metal layer 126, such as at least 90 percent of the total surface area of plated metal layer 126.

While plated metal layer 126 is suitable for wire bonding and solder connections at the exposed ends of leads 111, it may not provide suitable mechanical bonding to a mold compound of a package. Adding adhesion promotion coating 128 over plated metal layer 126 allows wire bonding solder connections to leadframe 108 with improved mechanical bonding to mold compound. For example, adhesion promotion coating 128 may mitigate undesirable sulfurization of plated metal layer 126, which can be detrimental to mechanical bonding to mold compound. As referred to herein, an adhesion promotion coating is a coating with stronger mechanical bonding to mold compound than the immediately adjacent layer, in this case, plated metal layer 126.

Leadframe 108 is formed on a single thin (about 120 to 250 μm) sheet of metal by stamping or etching. The ductility in this thickness range provides the 5 to 15% elongation that facilitates an intended bending and forming operation. The configuration or structure of the leadframe is stamped or etched from the starting metal sheet Multiple interconnected leadframes may be formed from a single sheet of substrate, the interconnected leadframes referred to as a leadframe strip. Leadframes on the sheet can be arranged in rows and columns. Tie bars, such as pad straps 115 (FIG. 2), interconnect pad 110, leads 112 and other elements of the leadframes to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to lead attachment, such as wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate semiconductor packages, each semiconductor package including a singulated leadframe, at least one die, electrical connections between the die and leadframe (such as gold, copper, or aluminum wire bonds) and the mold compound which covers at least part of these structures.

Tie bars and siderails may be removed during singulation of the packages formed with a single leadframe strip. The term leadframe of represents the portions of the leadframe strip remaining within a package after singulation. As shown in FIG. 2, leadframe 108 includes pad 110, two pad straps 115, and leads 111, although some of these elements are not interconnected following singulation of semiconductor package 100 into a discrete package.

FIG. 2 is a perspective hidden view of a portion of semiconductor package 100 assembled by solder 141 on a board 140, such as a printed circuit board (PCB). Semiconductor package 100 includes a semiconductor die 101 bonded with a die attach adhesive 113 onto a metallic pad 110 of a metallic leadframe 108. Semiconductor package 100 further includes a mold compound 130 covering semiconductor die 101, metallic bond pad 102, ball bond 104, copper wire 107, stitch bond 105 and end portion 112 of each lead 111, and partially covering pad 110. Exposed portions of leads 111 of leadframe 108 enable the solder attachment to board 140, whereas exposed portion of pad 110 supports conductive cooling of package 100.

As shown in FIG. 2, bond pads 102 of semiconductor die 101 are electrically connected by wire bonds 103 to respective leads 111. Each of wire bonds 103 include a ball bond 104 on one end of a wire 107 to connect to a respective bond pad 102 and a stitch bond 105 on the other end of the wire 107 to connect to a respective lead 111. Copper wires 107 of wire bonds 103, are made of electrically conductive copper or copper alloys. In some examples, wires 107 may have diameters between about 10 to 25 μm. In specific examples, bond pads 102 of semiconductor die 101 may be aluminum or copper bond pads over a dielectric layer of semiconductor die 101. In other examples, aluminum wires or gold wires may by substituted for copper wires 107.

Semiconductor die 101 may include any combination of semiconductor elements such as transistors and integrated circuits. In various examples of this disclosure, semiconductor die 101 may be implemented using any semiconductor material employed in industry, such as a silicon, gallium arsenide, gallium nitride, silicon germanium, or other semiconductor material. In addition, the techniques of this disclosure may be applied to semiconductor packages with any combination of active and passive components on a leadframe in addition to semiconductor die 101.

Leadframe 108 includes pad 110 and leads 111 spaced from pad 110 by a gap. Pad 110 is a substrate providing a stable support for firmly positioning semiconductor die 101 within semiconductor package 100. Leads 111 are shaped as cantilevered leads; in other examples, the leads may have other configurations, including but not limited to, the shape of flat leads as used in Quad Flat No-Lead (QFN) devices or in Small Outline No-Lead (SON) devices.

Leadframe 108 further includes pad straps 115 which extend between pad 110 to an external surface of semiconductor package 100. Pad straps 115 function to support pad 110 within a leadframe strip prior to molding of mold compound 130 and singulation of semiconductor package 100 from an array of semiconductor packages manufactured on a common leadframe strip.

Semiconductor die 101 is bonded on pad 110 with die attach adhesive 113. Adhesive 113 includes a plurality of components including a resin. The resin may include epoxy resins, polyurethane resins, and/or silicone resins. The resin may be filled or unfilled, and die attach adhesive 113 may further include one or more of the following: hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE, to more closely match semiconductor die 101 for example, increase thermal conductivity, increase elastic modulus of adhesive 113 compared to the resin base. Particulate fillers may be selected to reduce strength characteristics such as tensile strength and flexural strength compared to the resin base materials.

Semiconductor die 101, pad 110, and wire bonds 103 are covered by mold compound 130. End portions 112 of leads 111, which carry stitch bonds 105, are also covered by mold compound 130, while leads 111 extend to an exterior surface of the mold compound to facilitate electrical connections between package 100 and external components, such as board 140. Mold compound 130 provides a protective outer layer for semiconductor die 101 and wire bonds 103 formed in a molding process. In some examples, mold compound 130 includes an epoxy such as an epoxy-based thermoset polymer.

Figure 3A:
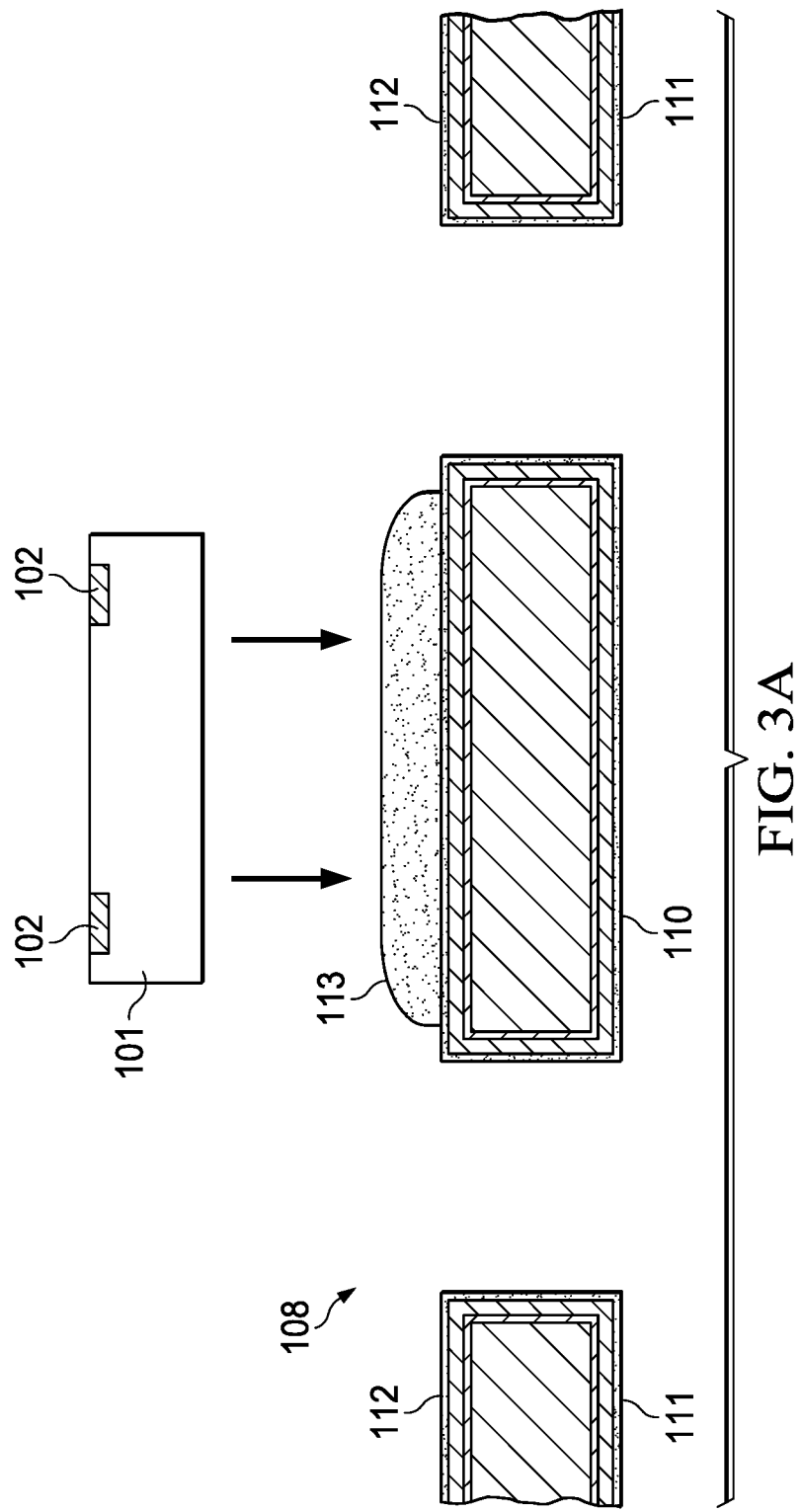
Figure 4:
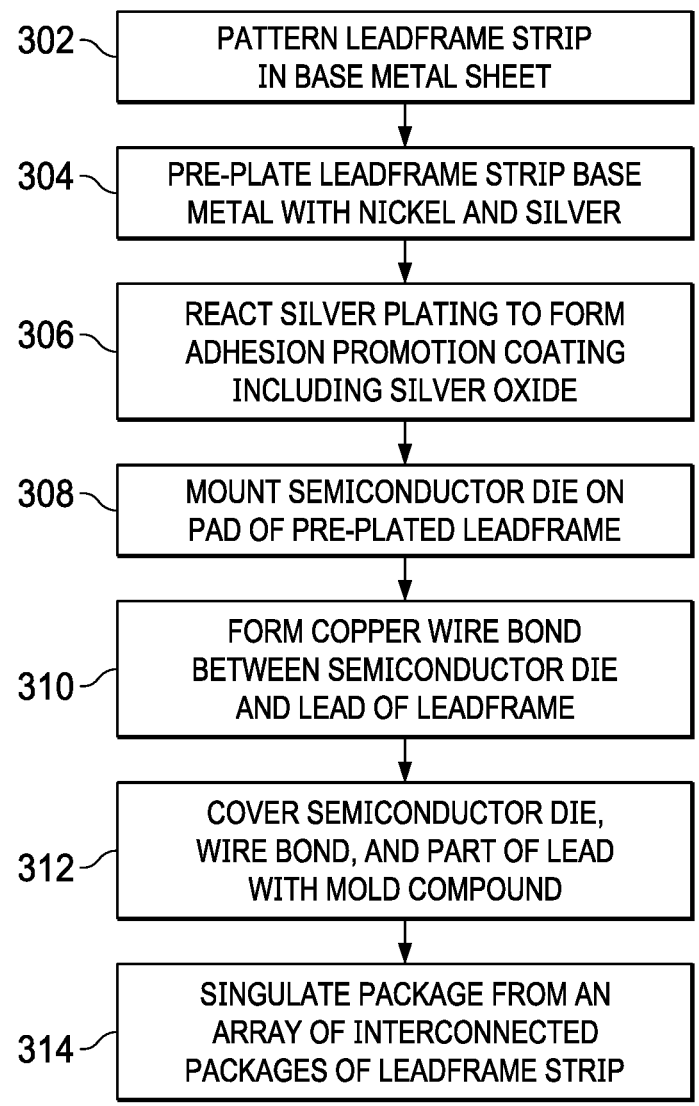
FIG. 4 is a flowchart of a method of fabricating a semiconductor package including pre-plating a leadframe.

FIGS. 3A-3C illustrate conceptual process steps for manufacturing semiconductor package 100. FIG. 4 is a flowchart of a method of fabricating a semiconductor package including pre-plating a leadframe. For clarity, the method of FIG. 4 is described with reference to semiconductor package 100 and FIGS. 3A-3C; however, the described techniques may be adapted to other package designs and are not limited to the specific example of semiconductor package 100.

First, the shape of a leadframe strip is patterned in a base metal, such as a copper sheet (FIG. 4, step 302). In various examples, manufacturing leadframe strip may include stamping or photo etching a planar base metal to form the shape of leadframe strip. The leadframe strip includes bass metal 122 of multiple interconnected leadframes 108 with pads 110 and leads 111, as well the elements to interconnect adjacent leadframes, such as pad straps 115 and optional siderails.

Base metal 122 of the leadframe strip is cleaned and immersed in a solution containing nickel, then the leadframe strip is electroplated to form first plated metal layer 124 in contact with base metal 122. Next, the base metal 122 a plated metal layer 124 is immersed in a solution containing silver, then electroplated to form second plated metal layer 126 in contact with first plated metal layer 124 (FIG. 4, step 304). Following the electroplating, the plated metal layers 124, 126 cover substantially all of the leadframe strip, although portions of base metal 122 may be exposed during later processing, such as singulation.

Following the plating steps, plated metal layer 126 is reacted to form adhesion promotion coating 128. As one example, the plated leadframe strip may be reacted with a reactive species to form adhesion promotion coating 128 including silver oxide (FIG. 4, step 306). One suitable commercially product suitable for forming adhesion promotion coating 128 is AgPrep®, is available from Atotech® of Berlin, Germany. Following the electroplating, adhesion promotion coating 128 covers substantially all of plated metal layer 126, although portions of base metal 122 may be exposed during later processing, such as singulation.

As shown in FIG. 3A, adhesive 113 is applied to pad 110 of leadframe 108. Die attach adhesive 113 may represent a thermal interface material, such as a conductive or nonconductive thermal paste. Such examples may facilitate heat dissipation from semiconductor die 101 through pad 110.

As shown in FIG. 3B, semiconductor die 101 is placed in contact with adhesive 113 on pad 110, and adhesive 113 is cured to bond semiconductor die 101 to pad 110 (FIG. 4, step 308). Curing adhesive 113 may include holding the assembly of leadframe 108 and semiconductor die 101 at a prescribed temperature for a prescribed period of time.

As shown in FIG. 3C, wire bonds 103 are formed between semiconductor die 101 and end portions 112 of leads 111 (FIG. 4, step 310). Copper wire 107 of wire bond 103 is connected to bond pad 102 with ball bond 104. Wire 107 is a composed metal such as a copper or copper alloy and has typically a diameter of about 10 to 25 μm. In some examples, copper wire 107 is made of copper at least 99% pure, such at least 99.99% pure, such as at least 99.999% pure.

A wire bonding formation process may begin with positioning semiconductor die 101 on a heated pedestal to raise the temperature to between 150 and 300° C. For copper and aluminum wires, ball formation and bonding may be performed in a reducing atmosphere such as dry nitrogen gas with a few percent hydrogen gas. Such a reducing atmosphere is generally not required for gold wires.

In a wire bonding process, the wire is strung through the capillary of an automated bonder. A capillary is an elongated tube of an inert material such as a ceramic with a fine bore (the capillary in the strict sense) suitable for guiding a metal wire used to form the gold bumps or wire bonds. At the wire end extruding from the capillary tip, a free air ball may be created by melting the wire end using either a flame or a spark technique. The capillary is moved towards an attachment area of one of bond pads 102.

Ball bond 104 may be created from a free air ball at the end of wire 107, then flattening this air ball against one of bond pads 102. The air ball has a typical diameter from about 1.2 to 1.6 times diameter of wire 107. The free air ball of melted wire is pressed against the metallization of the attachment area by a compression force, often combined with ultrasonic movement of the ball relative to the attachment area, transmitting ultrasonic energy, in order to attach a ball bond 104 to the underlying metal. The bonding process results in a metal nail head or squashed ball, as shown with respect to ball bonds 104.

After the ball attachment, the capillary with wire 107 may be lifted in a controlled loop to span an arch from the ball bond, such as ball bond 104, to an attachment area on a substrate or a leadframe, such as a lead stitch area of an end portion 112 of one of leads 111. When the wire touches the attachment area surface, the capillary tip is pressed against the wire in order to flatten it and thus to form a stitch bond, such as stitch bond 105, sometimes referred to as a wedge bond.

For substrate-based attachment areas, the bonding temperature may be about 160° C.; whereas for leadframe-based attachment areas, the bonding temperature may be between 240 and 260° C. The bonding force may be in the range from about 50 to 150 grams, and the ultrasonic energy may be in the range from about 80 to 180 milliamps. The stitch bond attachment process forms metal interdiffusions or welds.

The capillary rises again to a height sufficient to display a length of wire with enough metal to form the next ball. Then, a tear method is initiated to break the wire near the end of the stitch bond and leave the exposed wire length dangling from the capillary tip ready for the next ball-forming melting step. Various wire-breaking methods are commonly employed, such as a clamp-tear method and a table-tear method.

Wire bonding on adhesion promotion coating 128 may require careful selection of wirebond parameters to provide a suitable result, including suitable wire pull force. For example, surface roughness of the capillary may affect the ultrasonic transfer. As another example, a smaller face angle of the capillary may improve the bondability. As another example increasing scrubbing cycles may improve bondability, although that reduces throughput.

Following the formation of wire bonds 103, the assembly of leadframe 108, semiconductor die 101, adhesive 113, and wire bonds 103 is covered in mold compound 130, with portions of pad 110 and leads 112 remaining exposed on an outer surface of semiconductor package 100 (FIG. 4, step 312). Mold compound 130 is molded around the assembled semiconductor die 101 and leadframe 108 portions. In this process, leadframe 108, with the attached and bonded semiconductor die 101, is placed in the cavity of a mold, such as a steel mold. A heated and viscous mold compound, such as an epoxy resin filled with inorganic granules, such as alumina and silicon dioxide, is pressured into the cavity to fill the cavity and surround semiconductor die 101 and leadframe 108 portions without voids. Mold compound 130 covers pad 110 and at least portions of leads 111, such as lead end portions 112. Mold compound 130 may require an extended polymerization period ("curing"; commonly at 175° C. for 5 to 6 hr). After polymerizing the mold compound and cooling to ambient temperature, the mold is opened, while mold compound 130 remains adhered to the molded parts. As leadframe 108 is part of leadframe strip, all the leadframe and die assemblies of the leadframe strip may be molded in unison. Individual semiconductor packages remain interconnected as part of leadframe strip after being covered with mold compound 130.

Following molding of mold compound 130, semiconductor package 100 is singulated from the array of interconnected packages manufactured on the leadframe strip (FIG. 4, step 314). For example, singulation may include cutting through leadframe strip to separate semiconductor package 100 from a plurality of semiconductor packages 100 manufactured on leadframe strip. Portions of leadframe strip may be discarded following singulation. Following singulation, leads 111 may be bent into their final positions, if needed.

FIGS. 5-8 are scatter plots of experiments demonstrating robustness of wire bonds to pre-plated leadframes with a nickel-plating layer. The data illustrated in FIGS. 5-8 is provided as demonstration of potential wire bond characteristics of some examples of this disclosure. Other examples of this disclosure will have different wire bond characteristics.

Figure 5:
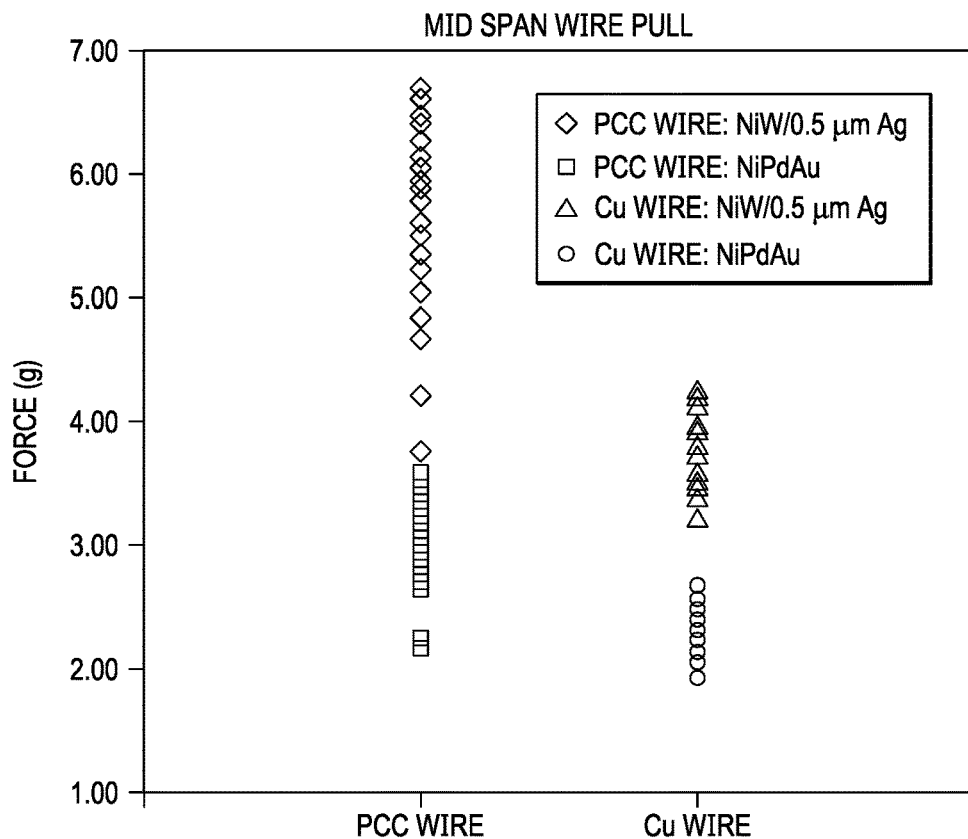
FIGS. 5-8 are experimental data plots demonstrating robustness of wire bonds to pre-plated leadframes with a nickel-plating layer.

FIG. 5 illustrates mid-span wire pull force failure data sets for four different leadframe and wire combinations: (1) Palladium Coated Copper (PCC) wire on leadframes pre-plated with a NiW alloy and a 0.5-micron layer of Ag; (2) PCC wire on leadframes flood-plated with Ni—Pd—Au; (3) Cu wire on leadframes pre-plated with a NiW alloy and a 0.5-micron layer of Ag; and (4) PCC wire on leadframes flood-plated with Ni—Pd—Au. The mid-span wire pull force testing include pulling on the middle of a wire bond attached to a leadframe on both ends, stressing a both attachments to the leadframe simultaneously.

As shown in FIG. 5, PCC wire on leadframes pre-plated with a NiW alloy and a 0.5-micron layer of Ag provided a failure force ranging from about 4.5 grams to about 6.8 grams. PCC wire on leadframes flood-plated with Ni—Pd—Au provided a failure force ranging from about 2.5 grams to about 3.8 grams. Cu wire on leadframes pre-plated with a NiW alloy and a 0.5-micron layer of Ag provided a failure force ranging from about 3.0 grams to about 4.5 grams. Cu wire on leadframes flood-plated with Ni—Pd—Au provided a failure force ranging from about 2.0 grams to about 2.7 grams. Thus, this experiment demonstrates that the leadframes pre-plated with a NiW alloy and a 0.5-micron layer of Ag provided a higher mid-span wire pull strength than the leadframes flood-plated with Ni—Pd—Au for both PCC wire and Cu wire.

Figure 6:
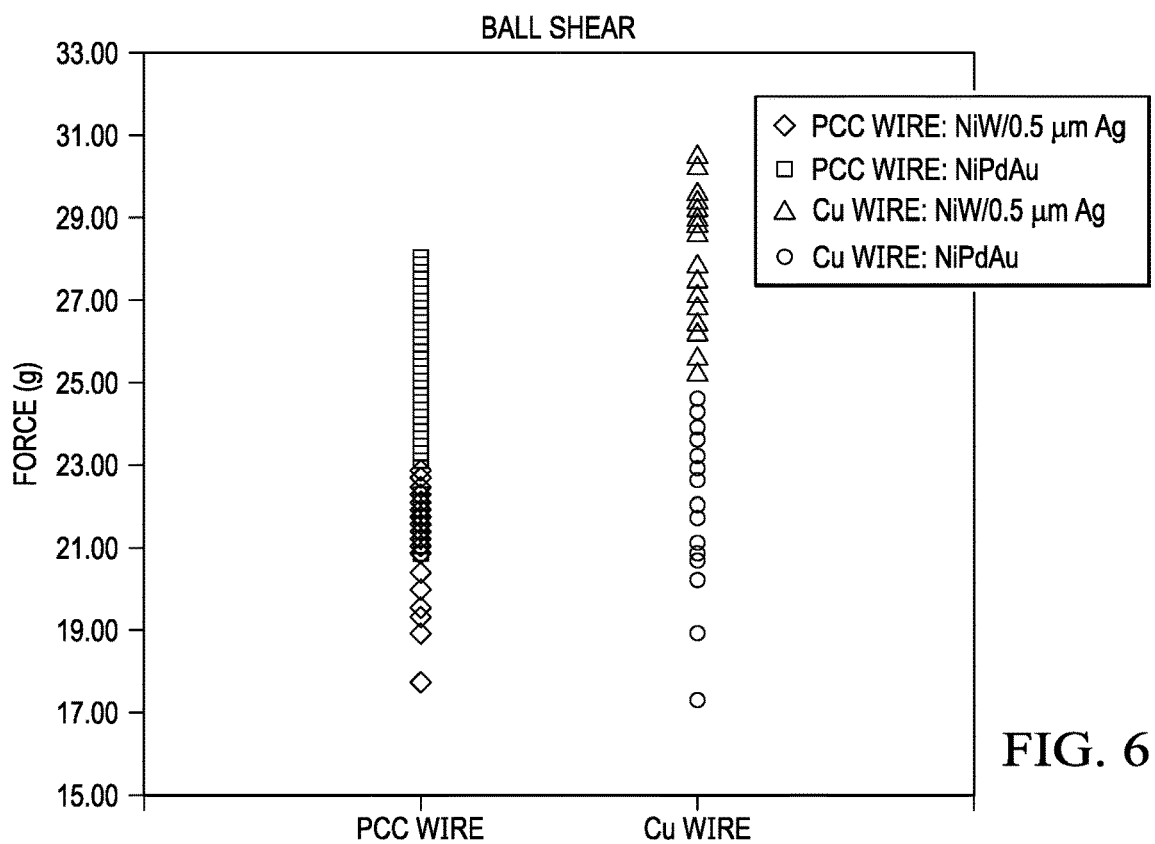

FIG. 6 illustrates ball shear force failure data sets for four different leadframe and wire combinations: (1) PCC wire on leadframes pre-plated with a NiW alloy and a 0.5-micron layer of Ag; (2) PCC wire on leadframes flood-plated with Ni—Pd—Au; (3) Cu wire on leadframes pre-plated with a NiW alloy and a 0.5-micron layer of Ag; and (4) PCC wire on leadframes flood-plated with Ni—Pd—Au. The ball shear force testing include applying a shear force to a ball bond attached to a leadframe.

As shown in FIG. 6, PCC wire on leadframes pre-plated with a NiW alloy and a 0.5-micron layer of Ag provided a failure force ranging from about 17 grams to about 23 grams. PCC wire on leadframes flood-plated with Ni—Pd—Au provided a failure force ranging from about 20 grams to about 28 grams. Cu wire on leadframes pre-plated with a NiW alloy and a 0.5-micron layer of Ag provided a failure force ranging from about 17 grams to about 25 grams. Cu wire on leadframes flood-plated with Ni—Pd—Au provided a failure force ranging from about 25 grams to about 31 grams. This experiment demonstrates that the leadframes flood-plated with Ni—Pd—Au for both PCC wire and Cu wire provided a higher ball shear strength than the leadframes pre-plated with a NiW alloy and a 0.5-micron layer of Ag. However, the ball shear strength for the leadframes pre-plated with a NiW alloy and a 0.5-micron layer of Ag is suitable for most if not all applications as ball shear failure modes are unlikely as the ball shear strength of each example far exceeds wire pull strength (see FIGS. 5 and 7).

Figure 7:
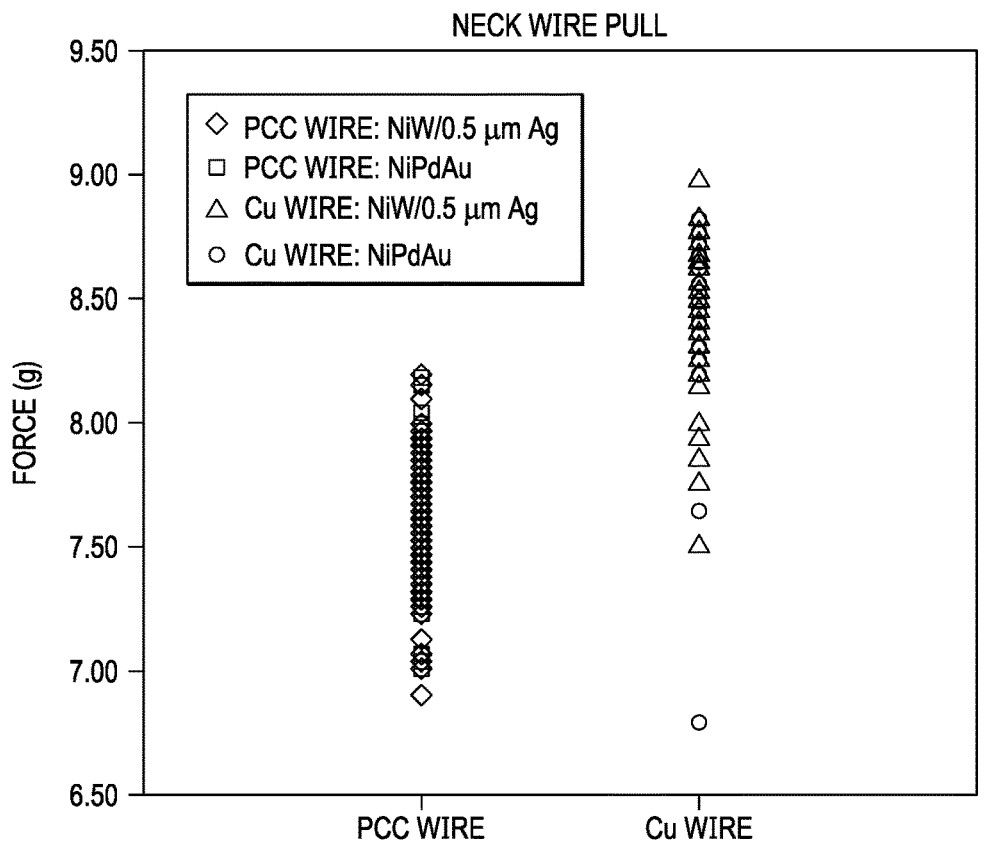

FIG. 7 illustrates neck wire pull force failure data sets for four different leadframe and wire combinations: (1) PCC wire on leadframes pre-plated with a NiW alloy and a 0.5-micron layer of Ag; (2) PCC wire on leadframes flood-plated with Ni—Pd—Au; (3) Cu wire on leadframes pre-plated with a NiW alloy and a 0.5-micron layer of Ag; and (4) PCC wire on leadframes flood-plated with Ni—Pd—Au. The neck wire pull force testing include pulling on a wire attached on one end to a leadframe, stressing a single attachment to the leadframe.

As shown in FIG. 7, PCC wire on leadframes pre-plated with a NiW alloy and a 0.5-micron layer of Ag provided a failure force ranging from about 6.8 grams to about 8.3 grams. PCC wire on leadframes flood-plated with Ni—Pd—Au provided a failure force ranging from about 6.9 grams to about 8.3 grams. Cu wire on leadframes pre-plated with a NiW alloy and a 0.5-micron layer of Ag provided a failure force ranging from about 7.5 grams to about 8.9 grams. Cu wire on leadframes flood-plated with Ni—Pd—Au provided a failure force ranging from about 7.6 grams to about 8.8 grams, excluding an outlier data point at about 6.7 grams. Thus, this experiment demonstrates that the leadframes pre-plated with a NiW alloy and a 0.5-micron layer of Ag provided wire pull strength similar to that of the leadframes flood-plated with Ni—Pd—Au for both PCC wire and Cu wire.

Figure 8:
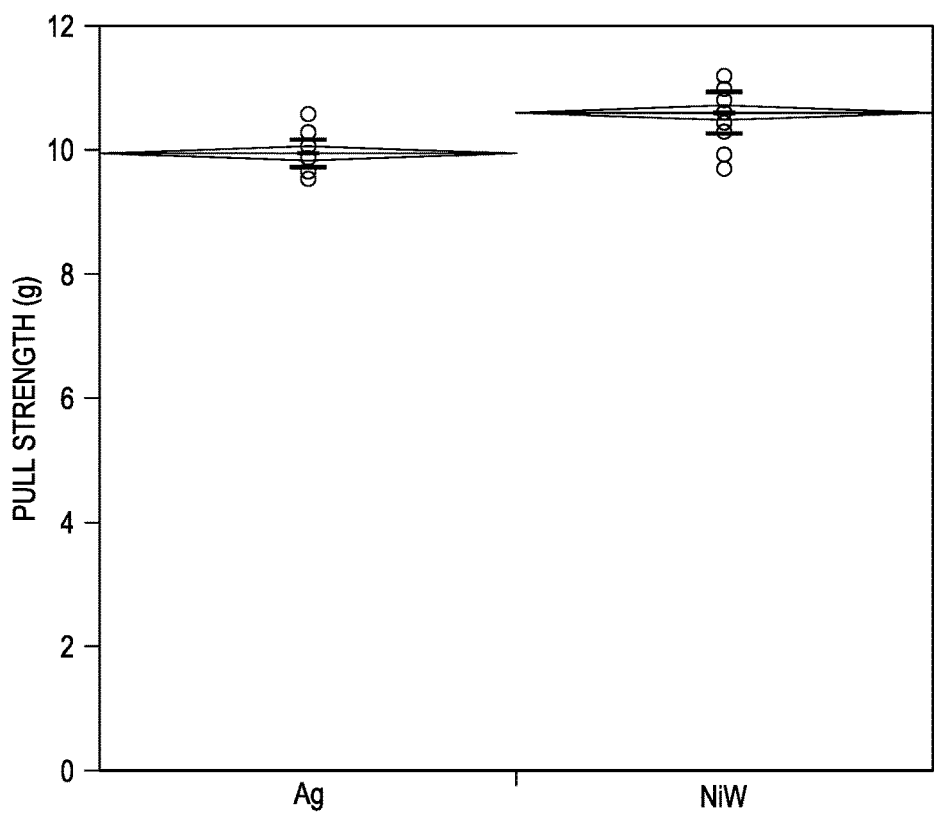

FIG. 8 illustrates mid-span wire pull force failure data sets for two different leadframe and wire combinations: (1) 25-micron aluminum (Al) wire on leadframes spot-plated with Ag at a thickness of about 5 microns; and (2) 25-micron Al wire on leadframes pre-plated with a NiW alloy and a 0.5-micron layer of Ag. The mid-span wire pull force testing include pulling on the middle of a wire bond attached to a leadframe on both ends, stressing a both attachments to the leadframe simultaneously.

As shown in FIG. 8, 25-micron Al wire on leadframes spot-plated with Ag provided a failure force ranging from about 9.5 grams to about 10.7 grams. 25-micron Al wire on leadframes pre-plated with a NiW alloy and Ag provided a failure force ranging from about 9.7 grams to about 11.3 grams. During the testing, both the 25-micron Al wire on leadframes spot-plated with Ag and the 25-micron Al wire on leadframes pre-plated with a NiW alloy and Ag always failed at the wedge bond necks, and not by separation between the wire and leadframe or by breaking the wire loop. This experiment demonstrates that the leadframes pre-plated with a NiW alloy and a 0.5-micron layer of Ag provided a higher mid-span wire pull strength than the leadframes spot-plated with Ag for 25-micron Al wire. While specific data is not presented herein, similar results occurred with gold (Au) wire as with the Al wire such that the leadframes pre-plated with a NiW alloy and Ag are also suitable for gold wire bonding.

The specific techniques for pre-plated leadframes with a nickel metal layer and silver metal layer over the nickel metal layer, such as described with respect to leadframe 108 of semiconductor package 100, are merely illustrative of the general inventive concepts included in this disclosure as defined by the following claims.

What is claimed is:

1. A method for manufacturing a semiconductor package, the method comprising:
   forming a ball bond of a wire on a semiconductor die attached to a metal pad of a pre-plated leadframe;
   forming a stitch bond of the wire on a lead of the pre-plated leadframe to complete a wire bond between the semiconductor die and the lead; and
   covering the semiconductor die and wire bond in a mold compound,
   wherein the pre-plated leadframe includes:
   a base metal predominantly including copper;
   a first plated metal layer in contact with the base metal, the first plated metal layer predominantly including nickel,
   wherein the first plated metal layer has a first plated metal layer thickness of 0.1 to 5 microns;
   a second plated metal layer in contact with the first plated metal layer, the second plated metal layer predominantly including silver,
   wherein the second plated metal layer has a second plated metal layer thickness of 0.2 to 5 microns; and
   an adhesion promotion coating in contact with the second plated metal layer opposite the first plated metal layer, the adhesion promotion coating predominantly including silver oxide.

2. The method of claim 1, further comprising:
   cleaning the base metal;
   immersing the base metal in a first solution containing nickel;
   electroplating the base metal to form the first plated metal layer on the base metal;
   immersing the base metal and the first plated metal layer in a second solution containing silver;
   electroplating the base metal and the first plated metal layer to form the second plated metal layer on the first plated metal layer; and
   reacting the second plated metal layer to form the adhesion promotion coating including the silver oxide.

3. The method of claim 1, further comprising covering the semiconductor die and the wire bond, and partially covering the pad and lead with a mold compound, with the pad and the lead remaining exposed on an outer surface of the semiconductor package.

4. The method of claim 1, wherein the first plated metal layer includes a nickel alloy.

5. The method of claim 4, wherein the nickel alloy includes one or more of a group consisting of:
   cobalt;
   molybdenum;
   a lanthanide; and
   tungsten.

6. The method of claim 1, wherein the first plated metal layer is substantially free of nickel oxide.

7. The method of claim 1,
   wherein the first plated metal layer thickness is 0.2 to 4 microns, and
   wherein the second plated metal layer thickness is 0.5 to 1.5 microns.

8. The method of claim 1, wherein the adhesion promotion coating has an adhesion promotion coating thickness of 1.0 to 3.0 nanometers (nm).

9. The method of claim 1,
   wherein the first plated metal layer covers at least 90 percent of a total surface area of the base metal, wherein the second plated metal layer covers at least 90 percent of a total surface area of the first plated metal layer, and wherein the adhesion promotion coating covers at least 90 percent of a total surface area of the second plated metal layer.

10. The method of claim 1, wherein the wire is a copper wire.

11. The method of claim 1, wherein the wire is an aluminum wire.

12. The method of claim 1, wherein the wire is a gold wire.

\* \* \* \* \*